United States Patent
Ishihara et al.

(10) Patent No.: US 9,538,663 B2
(45) Date of Patent: Jan. 3, 2017

(54) COMBINED WIRING BOARD AND METHOD FOR MANUFACTURING COMBINED WIRING BOARD

(71) Applicant: IBIDEN CO., LTD., Ogaki-shi (JP)

(72) Inventors: Teruyuki Ishihara, Ogaki (JP); Michimasa Takahashi, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 296 days.

(21) Appl. No.: 14/077,563

(22) Filed: Nov. 12, 2013

(65) Prior Publication Data

US 2014/0133111 A1 May 15, 2014

(30) Foreign Application Priority Data

Nov. 9, 2012 (JP) ................................ 2012-247048

(51) Int. Cl.
*H05K 1/14* (2006.01)
*H05K 3/00* (2006.01)

(52) U.S. Cl.
CPC .............. *H05K 3/00* (2013.01); *H05K 3/0097* (2013.01); *H05K 2201/096* (2013.01); *H05K 2201/10545* (2013.01); *H05K 2203/0169* (2013.01); *H05K 2203/167* (2013.01); *Y10T 29/49124* (2015.01)

(58) Field of Classification Search
CPC ........ H05K 1/142; H05K 1/0271; H05K 1/14; H05K 3/0097; H05K 3/0052; H05K 2203/0169; H05K 2201/10424; H05K 2201/09145

USPC .................................................. 174/250, 255
See application file for complete search history.

(56) References Cited

U.S. PATENT DOCUMENTS

2010/0115766 A1* 5/2010 Hasegawa ............ H05K 3/0097
29/830
2010/0310829 A1* 12/2010 Yada .................... H05K 3/0097
428/172

FOREIGN PATENT DOCUMENTS

JP        2011-023657        2/2011

OTHER PUBLICATIONS

U.S. Appl. No. 14/076,554, filed Nov. 11, 2013, Ishihara, et al.
U.S. Appl. No. 14/076,586, filed Nov. 11, 2013, Takahashi, et al.

* cited by examiner

*Primary Examiner* — Hoa C Nguyen
*Assistant Examiner* — Amol Patel
(74) *Attorney, Agent, or Firm* — Oblon, McClelland, Maier & Neustadt, L.L.P.

(57) ABSTRACT

A method for manufacturing a combined wiring board includes providing a metal frame having an accommodation opening portion, positioning a wiring board in the accommodation opening portion of the metal frame, and subjecting the metal frame to plastic deformation such that a sidewall of the wiring board is connected to a sidewall of the metal frame inside the accommodation opening portion of the metal frame.

21 Claims, 14 Drawing Sheets

FIG. 3
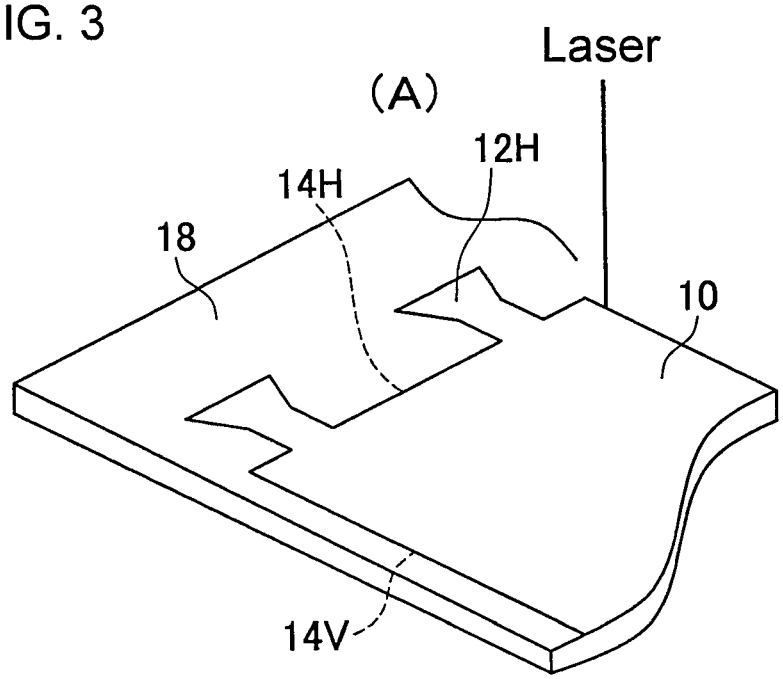
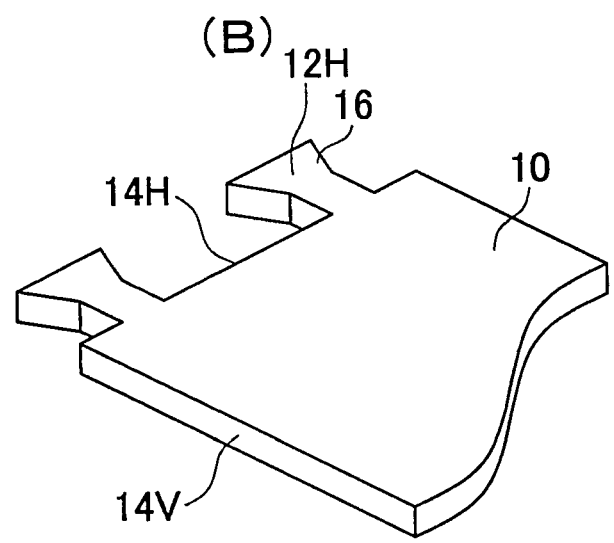

FIG. 4
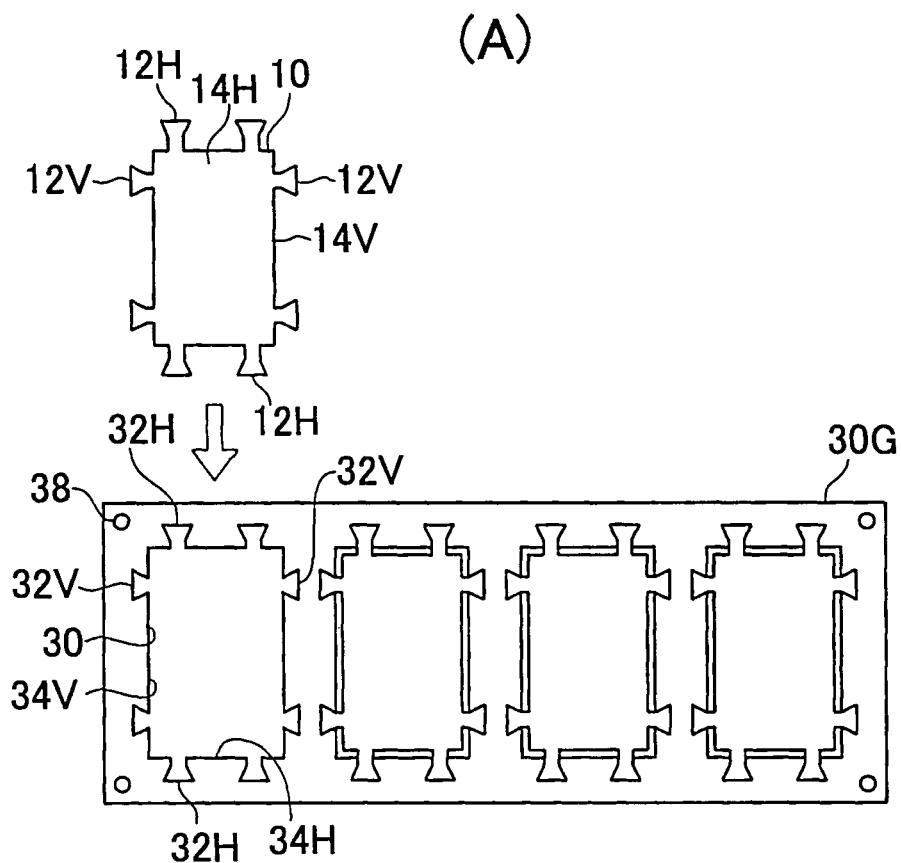
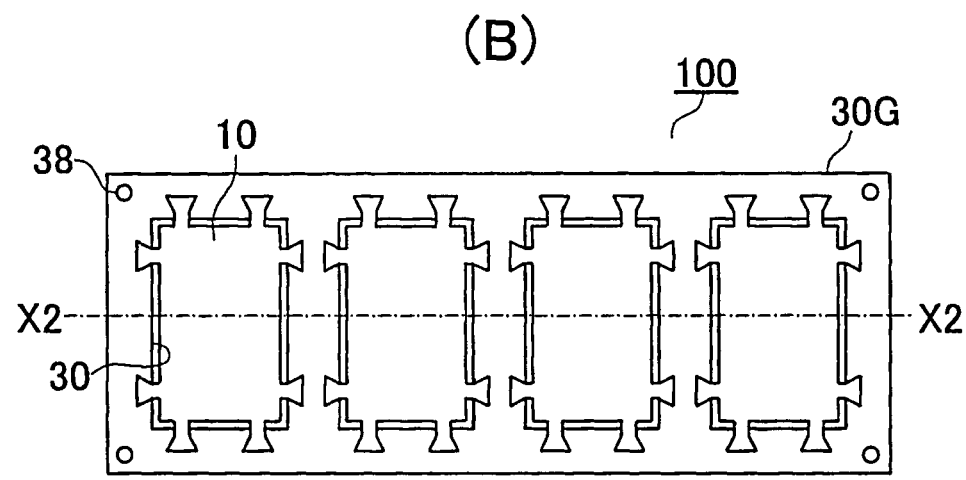

FIG. 14
(A)
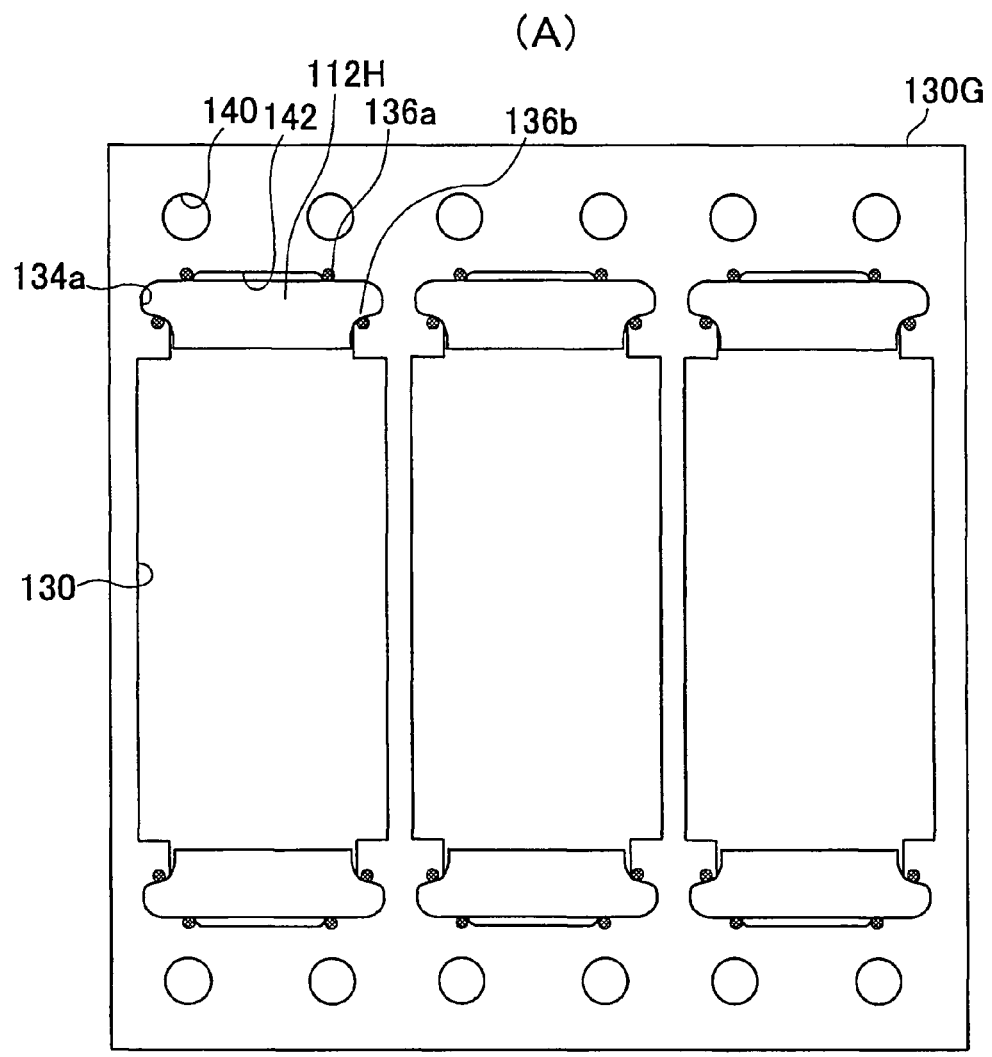
(B)
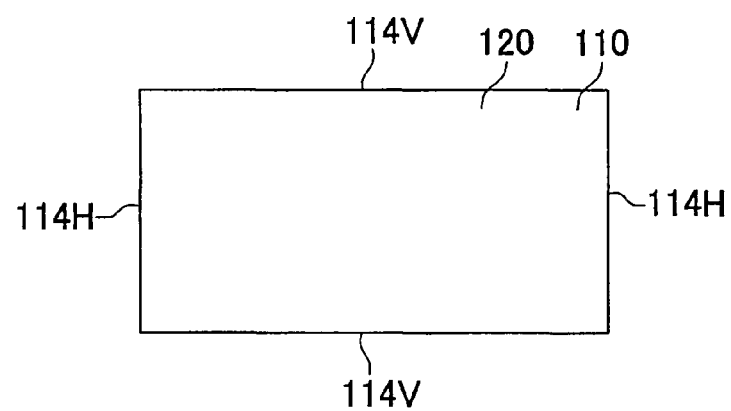

COMBINED WIRING BOARD AND METHOD FOR MANUFACTURING COMBINED WIRING BOARD

CROSS-REFERENCE TO RELATED APPLICATIONS

The present application is based upon and claims the benefit of priority to Japanese Patent Application No. 2012-247048, filed Nov. 9, 2012, the entire contents of which are incorporated herein by reference.

BACKGROUND OF THE INVENTION

Field of the Invention

The present invention relates to a combined wiring board and a method for manufacturing the combined wiring board, and more particularly, to a combined wiring board in which wiring boards to be processed in reflow are fixed in a frame.

Description of Background Art

Mounting of electronic components and other wiring board processing may be carried out with multiple wiring boards of the same type contained in a wiring board accommodation kit. JP 2011-23657 A describes a multipiece wiring board accommodation kit which contains multiple piece wiring boards and a frame having accommodation holes to accommodate the piece wiring boards. The entire contents of this publication (these publications) are incorporated herein by reference.

SUMMARY OF THE INVENTION

According to one aspect of the present invention, a method for manufacturing a combined wiring board includes providing a metal frame having an accommodation opening portion, positioning a wiring board in the accommodation opening portion of the metal frame, and subjecting the metal frame to plastic deformation such that a sidewall of the wiring board is connected to a sidewall of the metal frame inside the accommodation opening portion of the metal frame.

According to another aspect of the present invention, a combined wiring board has a metal frame having an accommodation opening portion, and a wiring board is fixed to the metal frame inside the accommodation opening portion such that the metal frame has a side wall defining the accommodation opening portion and connected to a side wall of the wiring board. The metal frame has a portion subjected to plastic deformation such that the side wall of the metal frame holds the side wall of the wiring board inside the accommodation opening portion of the metal frame.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 3A and 3B are perspective views illustrating a printed wiring board to which laser beam machining is applied;

FIGS. 4A and 4B are plan views respectively illustrating a metal frame and a combined wiring board;

FIGS. 14A and 14B are plan views respectively illustrating a metal frame and a printed wiring board according to the second embodiment.

DETAILED DESCRIPTION OF THE EMBODIMENTS

Figure 1:
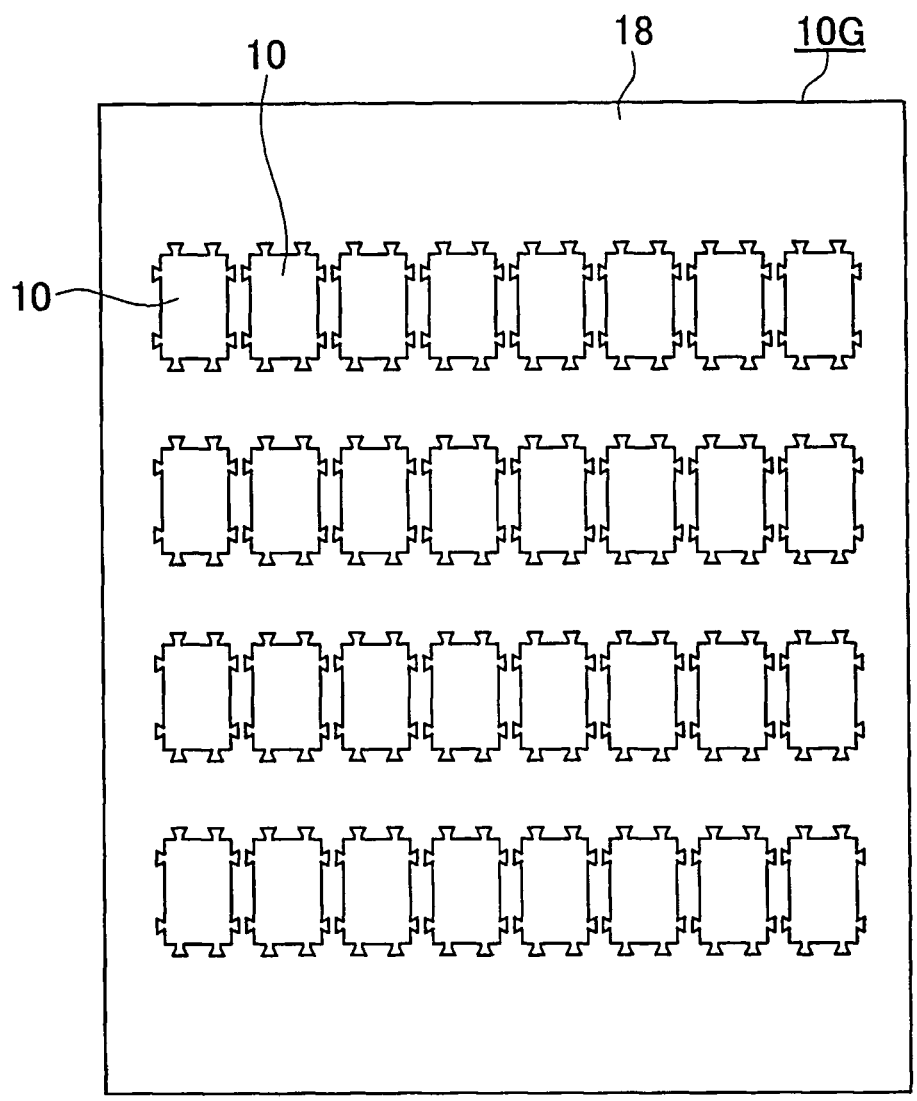
FIG. 1 is a plan view illustrating a multipiece printed wiring board.

The embodiments will now be described with reference to the accompanying drawings, wherein like reference numerals designate corresponding or identical elements throughout the various drawings.

First Embodiment

Figure 10:
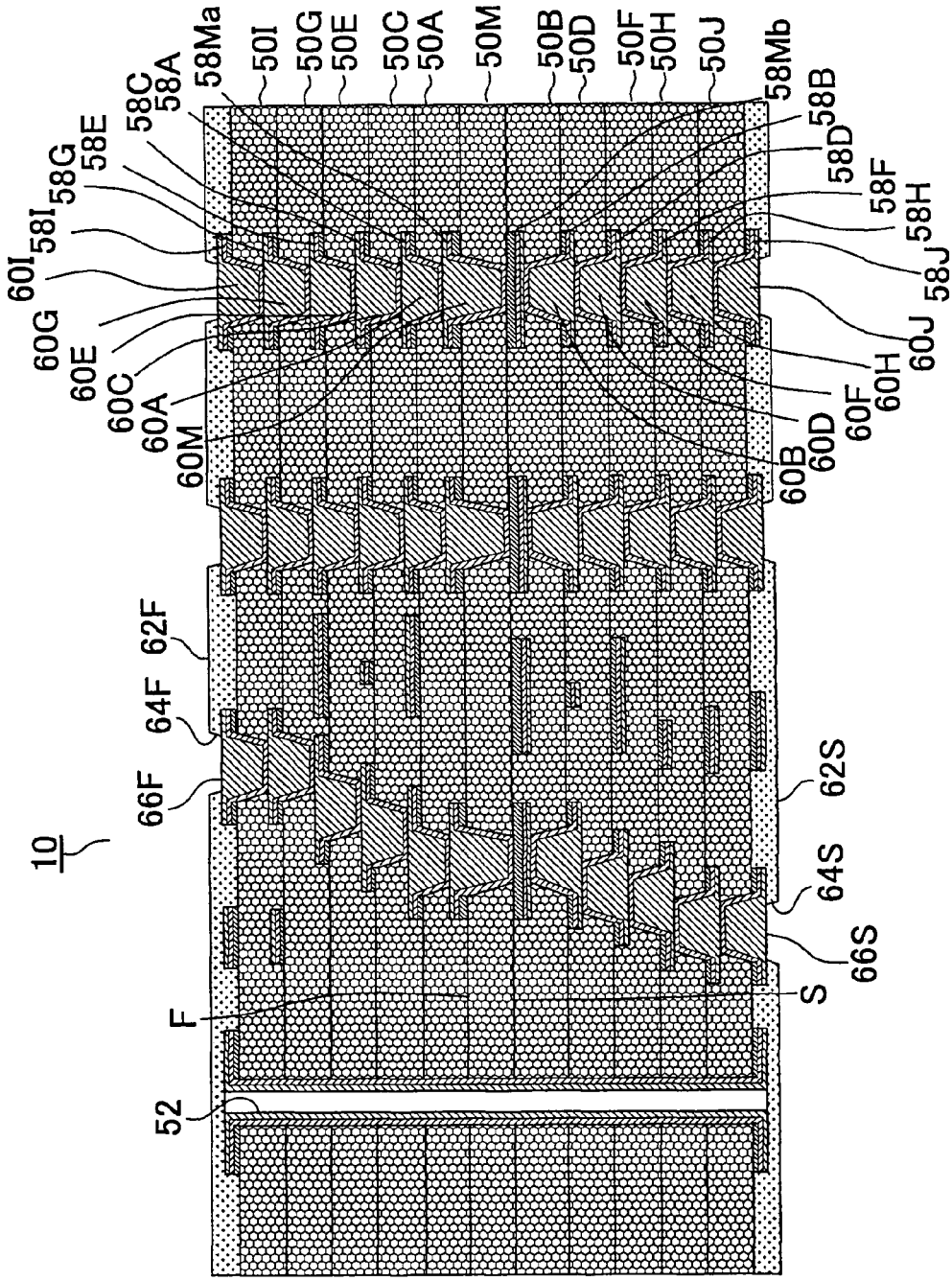
FIG. 10 is a cross-sectional view illustrating a printed wiring board of the first embodiment.

FIG. 10 is a cross-sectional view illustrating a printed wiring board according to a first embodiment before electronic components are mounted.

A printed wiring board 10 has interlayer insulation layers (50A, 50C, 50E, 50G, 50I) laminated on a first surface (F) and interlayer insulation layers (50B, 50D, 50F, 50H, 50J) laminated on a second surface (S) of a core insulation layer (50M) positioned in the center of the printed wiring board. A conductive circuit (58Ma) on the first surface (F) of the core insulation layer (50M) is connected to a conductive circuit (58Mb) on the second surface (S) thereof with a via conductor (60M).

In the interlayer insulation layer (50A) laminated on the first surface (F) of the core insulation layer (50M), a via conductor (60A) for connecting a conductive circuit (58A) on the interlayer insulation layer (50A) to a conductive circuit (58Ma) on the core insulation layer (50M) is formed. In the interlayer insulation layer (50C) laminated on the interlayer insulation layer (50A), a via conductor (60C) for connecting a conductive circuit (58C) on the interlayer insulation layer (50C) to a conductive circuit (58A) on the interlayer insulation layer (50A) is formed. In the interlayer insulation layer (50E) laminated on the interlayer insulation layer (50C), a via conductor (60E) for connecting a conductive circuit (58E) on the interlayer insulation layer (50E) to a conductive circuit (58C) on the interlayer insulation layer (50C) is formed. In the interlayer insulation layer (50G) laminated on the interlayer insulation layer (50E), a via conductor (60G) for connecting a conductive circuit (58G) on the interlayer insulation layer (50G) to a conductive circuit (58E) on the interlayer insulation layer (50E) is formed. In the interlayer insulation layer (50I) laminated on the interlayer insulation layer (50G), a via conductor (60I) for connecting a conductive circuit (58I) on the interlayer insulation layer (50I) to a conductive circuit (58G) on the interlayer insulation layer (50G) is formed. On the interlayer insulation layer (50I), a solder-resist layer (62F) is formed and the conductive circuit (58I) exposed through an opening (64F) in the solder-resist layer works as a pad (66F).

In the interlayer insulation layer (50B) laminated on the second surface (S) of the core insulation layer (50M), a via conductor (60B) for connecting a conductive circuit (58B) on the interlayer insulation layer (50B) to a conductive circuit (58Mb) on the core insulation layer (50M) is formed. In the interlayer insulation layer (50D) laminated on the interlayer insulation layer (50B), a via conductor (60D) for connecting a conductive circuit (58D) on the interlayer insulation layer (50D) to a conductive circuit (58B) on the interlayer insulation layer (50B) is formed. In the interlayer insulation layer (50F) laminated on the interlayer insulation layer (50D), a via conductor (60F) for connecting a conductive circuit (58F) on the interlayer insulation layer (50F) to a conductive circuit (58D) on the interlayer insulation layer (50D) is formed. In the interlayer insulation layer (50H) laminated on the interlayer insulation layer (50F), a via conductor (60H) for connecting a conductive circuit (58H) on the interlayer insulation layer (50H) to a conductive circuit (58F) on the interlayer insulation layer (50F) is formed. In the interlayer insulation layer (50J) laminated on the interlayer insulation layer (50H), a via conductor (60J) for connecting a conductive circuit (58J) on the interlayer insulation layer (50J) to a conductive circuit (58H) on the interlayer insulation layer (50H) is formed. On the interlayer insulation layer (50J), a solder-resist layer (62S) is formed and the conductive circuit (58J) exposed through an opening (64S) in the solder-resist layer works as a pad (66S). A through hole 52 that penetrates the interlayer insulation layers (50I, 50G, 50E, 50C, 50A, 50M, 50B, 50D, 50F, 50H, 50J) is formed.

Figure 11:
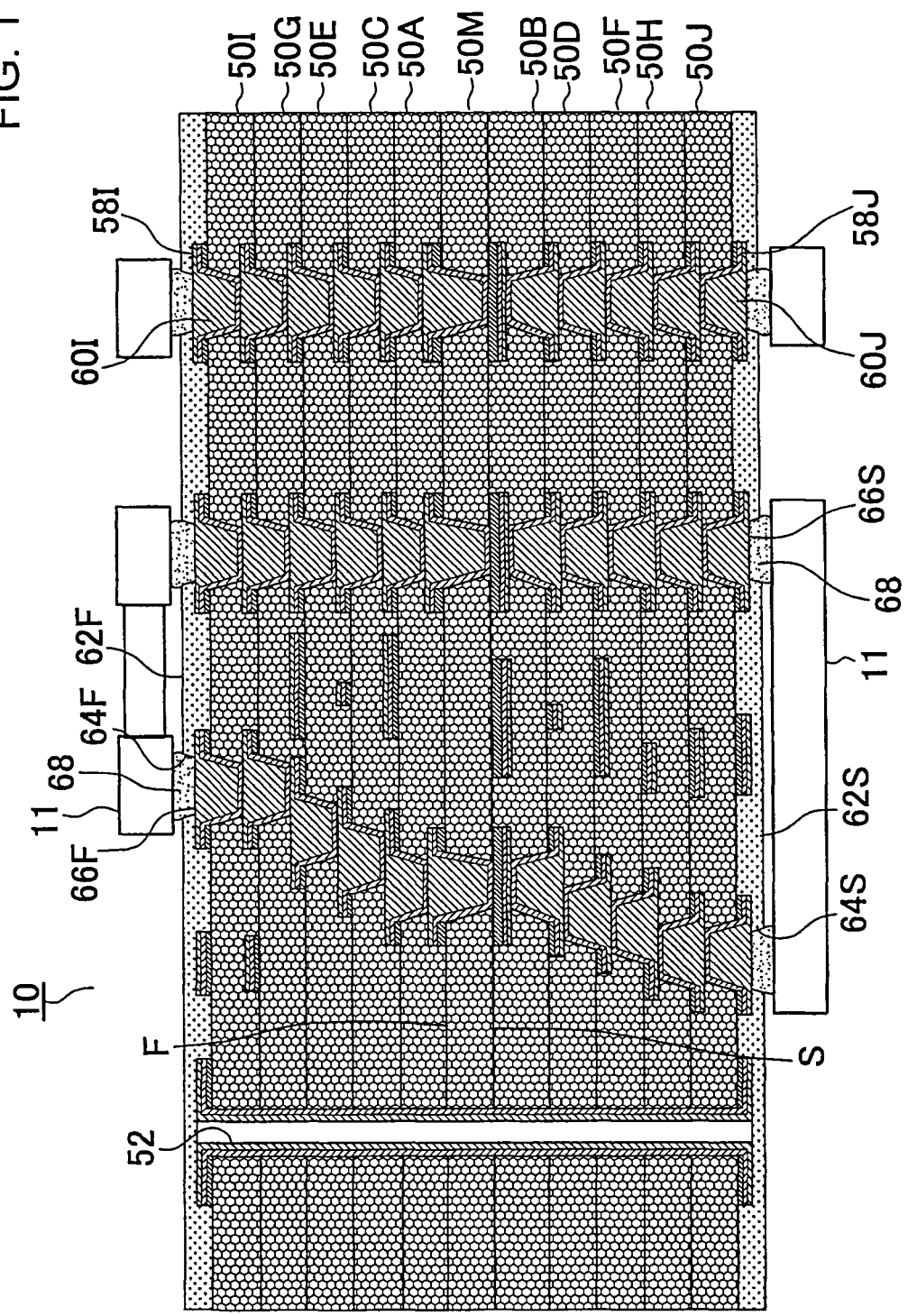
FIG. 11 is a cross-sectional view illustrating a printed wiring board of the first embodiment on which electronic components are mounted.

FIG. 11 is a cross-sectional view illustrating a printed wiring board on which electronic components are mounted.

An electronic component 11 is mounted on the first-surface (F) side of the printed wiring board through solder 68 disposed on the pad (66F). Another electronic component 11 is mounted on the second-surface side through solder 68 disposed on the pad (66S).

Figure 2:
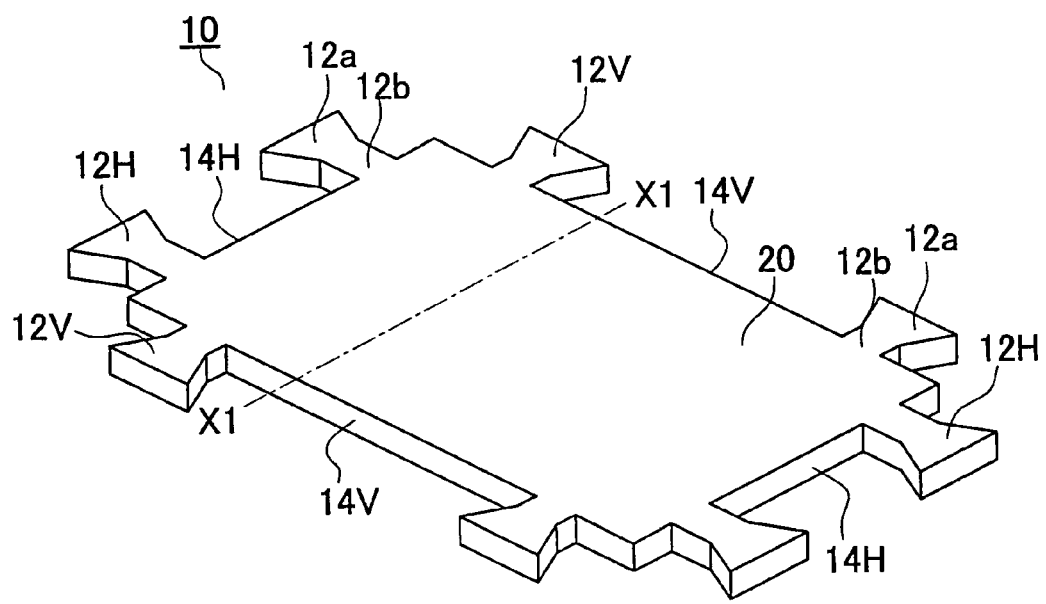
FIG. 2 is a perspective view illustrating a separated printed wiring board.

FIG. 1 is a plan view of a multipiece printed wiring board (10G) by which 8×4 pieces of printed wiring boards 10 are fabricated simultaneously. FIG. 2 is a perspective view of a printed wiring board 10, which is an individual piece separated from the multipiece printed wiring board (10G). FIG. 10 is a partially cross-sectional view taken along the line (X1-X1) in FIG. 2.

As shown in FIG. 1, the printed wiring boards 10 are fabricated inside a frame component 18 located on the outer perimeter of the multipiece printed wiring board (10G). As shown in FIG. 2, the printed wiring board 10 has two support tabs (12V) on each long-side sidewall (14V) of a rectangular main body 20 in such a way that two pairs of support tabs on each side face each other across the main body. Two support tabs (12H) are formed on each short-side sidewall (14H) in such a way that two pairs of support tabs on each side face each other across the main body. The support tab (12V) and support tab (12H) have the same shape, which is made up of a rectangular base portion (bridge portion) (12b) and a trapezoidal portion (12a) with a width increasing toward its tip.

In the first embodiment, when a printed wiring board 10 is cut out from a multipiece printed wiring board (10G), the printed wiring board is cut by a laser along the outline of the printed wiring board as shown in FIG. 3A and is separated as an individual piece as shown in FIG. 3B.

Figure 5:
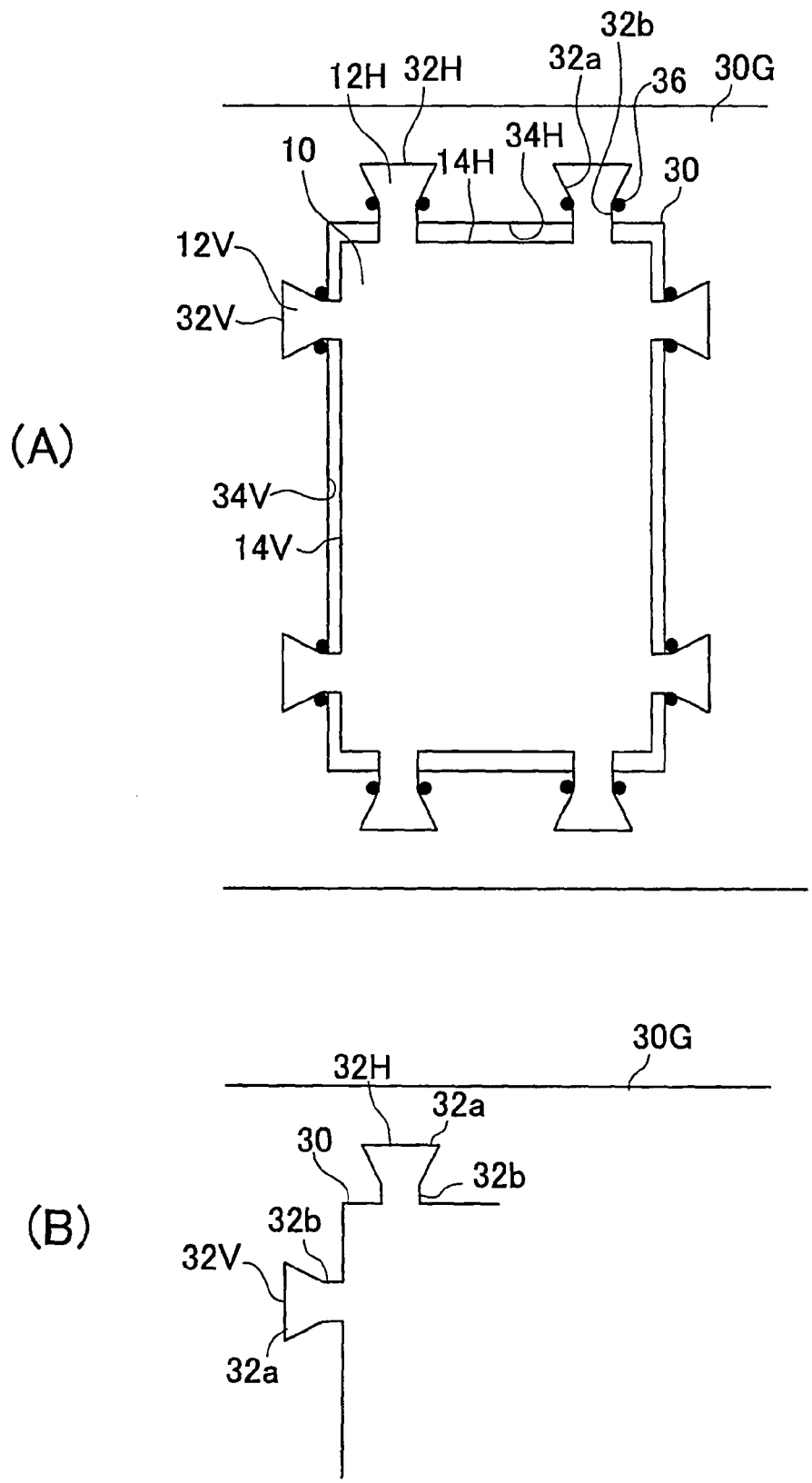
FIGS. 5A and 5B are plan views respectively illustrating a printed wiring board to which crimping is applied and slits.

FIG. 4A is a plan view illustrating a metal frame (30G) made of aluminum. The metal frame (30G) has four openings 30 for accommodating printed wiring boards and alignment holes 38 at four corners. The accommodation opening 30 has vertical walls (34V) which correspond to long-side sidewalls (14V) of a printed wiring board and horizontal walls (34H) which correspond to short-side sidewalls (14H) of the printed wiring board. Four slits (32V) corresponding to four support tabs (12V) of the printed wiring board are formed on the vertical walls (34V) and four slits (32H) corresponding to four support tabs (12H) of the printed wiring board are formed on the horizontal wall (34H). FIG. 5B is an enlarged view of the slits (32H, 32V). The slits (32H, 32V) have the same shape, which is made up of a base portion (32b) corresponding to a rectangular base portion (bridge portion) (12b) of a support tab of a printed wiring board and a trapezoidal portion (32a) corresponding to a trapezoidal portion (12a) of the support tab of the printed wiring board. The width of the trapezoidal portion (32a) is set to increase toward the outer rim of the accommodation opening 30.

Figure 6:
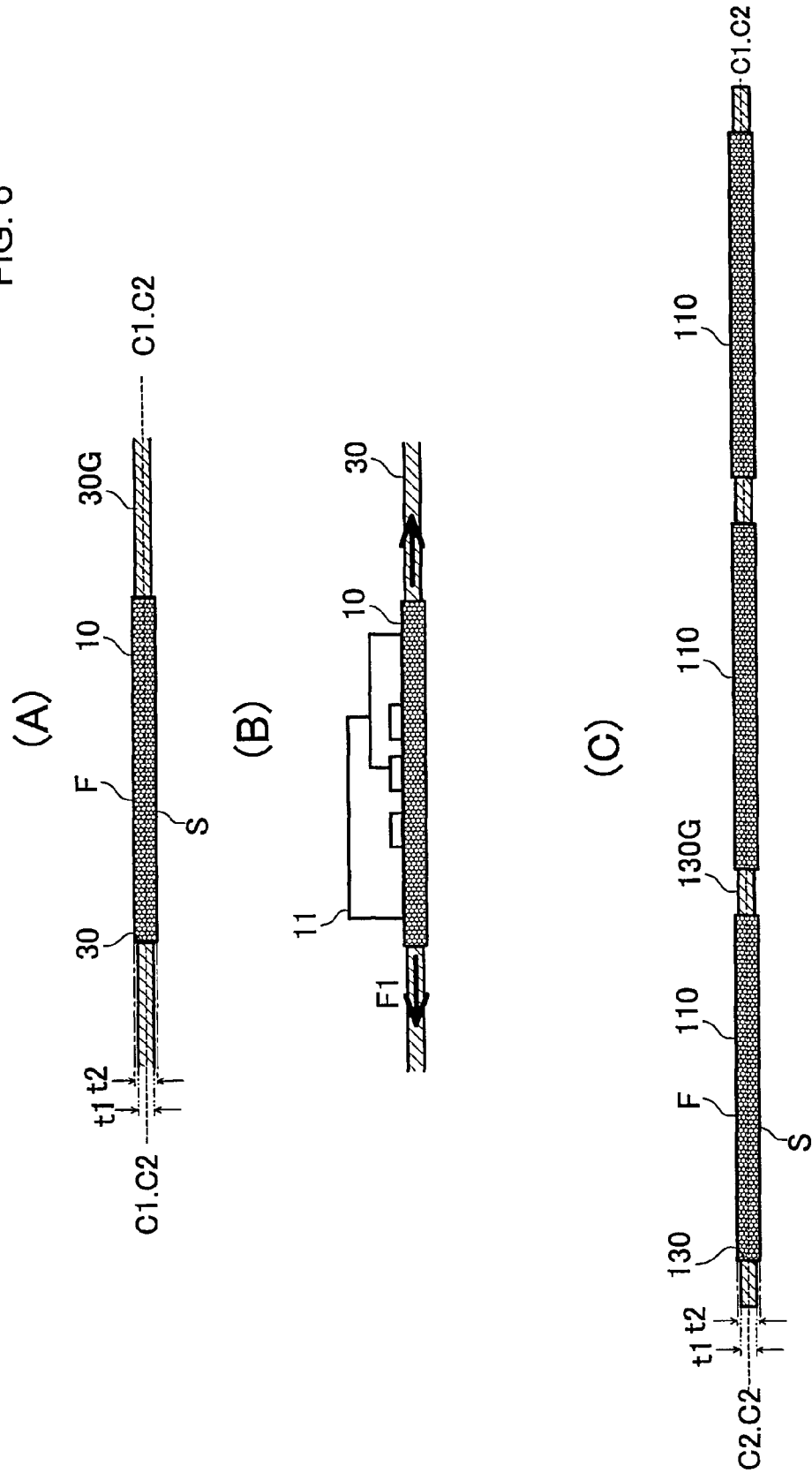
FIGS. 6A, 6B and 6C are cross-sectional views illustrating a combined wiring board.

FIG. 4B shows a state in which printed wiring boards 10 are fixed in all accommodation openings 30 of a metal frame (30G). FIG. 6A is a cross-sectional view taken along the line (X2-X2) of a printed wiring board 10 in FIG. 4B. The metal frame (30G) has thickness (t1) of 750 μm. The printed wiring board 10 has thickness (t2) of 780 μm. That is, the thickness of the metal frame is thinner than the thickness of the printed wiring board. The center plane (C1) in the thickness direction of the metal frame (30G) aligns with the center plane (C2) in the thickness direction of the printed wiring board 10. Accordingly, the upper surface of the metal frame (30G) is recessed from the upper surface (the first surface) (F) of the printed wiring board 10, and the lower surface of the metal frame (30G) is recessed from the lower surface (the second surface) (S) of the printed wiring board. The metal frame (30G), which is made of aluminum, has a thermal expansion coefficient of 23 ppm/° C. in a direction perpendicular to the main surface, and the printed wiring board, which is made of resin, has a thermal expansion coefficient of 16 ppm/° C. in a direction perpendicular to the main surface; the thermal expansion coefficient of the metal frame (30G) is higher than the thermal expansion coefficient of the printed wiring board.

By setting the thickness of the metal frame to be less than the thickness of the printed wiring board, warping due to a difference between the thermal expansion coefficients is controlled so as not to occur in the printed wiring board. By setting the metal frame (30G) to be recessed from the upper surface (the first surface) (F) of the printed wiring board 10 and to be recessed from the lower surface (the second surface) (S) of the printed wiring board 10, the printed wiring board 10 is fixed to the metal frame (30G) in such a way that the metal frame (30G) does not interfere with the mounting of electronic components on the printed wiring board. Although aluminum is used as a material for the metal frame in the first embodiment, copper, stainless steel or the like may also be used as long as it has a higher thermal expansion coefficient than the printed wiring board.

FIG. 5A shows a state in which the printed wiring board 10 is fixed in accommodation opening 30 of the metal frame (30G). The printed wiring board is fixed in the accommodation opening 30 with the support tab (12H) of the printed wiring board inserted into the slit (32H) and the support tab (12V) of the printed wiring board inserted into the slit (32V) of the accommodation opening 30. Predetermined clearance is set between the long-side sidewall (14V) of the printed wiring board and the vertical wall (34V) of the accommodation opening 30 corresponding to the long-side sidewall (14V), and clearance of a similar amount is also set between the short-side sidewall (14H) of the printed wiring board and the horizontal wall (34H) of the accommodation opening 30. Crimping portions 36 are formed on portions that are borders between the base portions (32b) and the trapezoidal portions (32a) of the slits (32H, 32V), and are adjacent to the support tabs (12H, 12V). With the crimping portions 36, the sidewalls of the slits (32H, 32V) and the sidewalls of the support tabs (12H, 12V) are pushed against and are in contact with each other.

Figure 7:
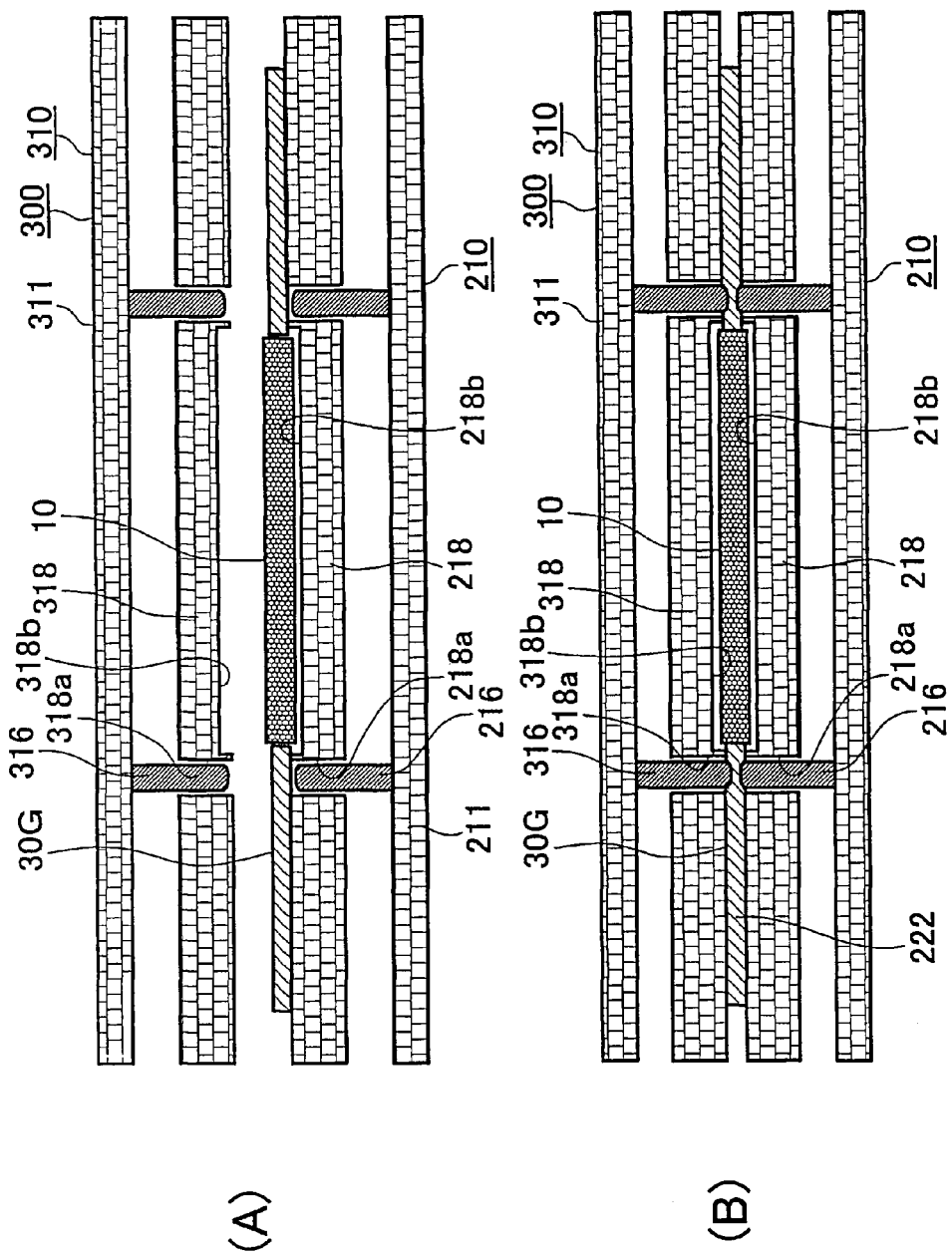
FIGS. 7A and 7B are cross-sectional views illustrating a crimping apparatus of a first embodiment.

FIG. 7A is a cross-sectional view illustrating a crimping apparatus 300 for applying crimping to a printed wiring board.

The crimping apparatus 300 is equipped with a lower tool 210 and an upper tool 310. The lower tool 210 has a base portion 211 and a support board 218. The support board 218 is supported so as to be vertically movable relative to the base portion 211. A punch 216 for crimping is attached to the base portion 211, and a through hole (218a) for the punch 216 to go through is formed on the support board 218. A recess (218b) is formed in the central part of the support board 218 so that no force is exerted on a printed wiring board during crimping. A printed wiring board 10 is placed on the recess (218b), and a metal frame (30G) is placed on the support board 218.

The upper tool 310 has a base portion 311 and a support board 318. The support board 318 is supported so as to be vertically movable relative to the base portion 311. A punch 316 for crimping is attached to the base portion 311, and a through hole (318a) for the punch 316 to go through is formed on the support board 318. A recess (318b) is formed in the central part of the support board 318.

FIG. 7B shows a state in which the upper tool 310 is pressed against the lower tool 210, the punch 316 of the upper tool 310 is pushed on the upper surface of the metal frame (30G), and the punch 216 of the lower tool 210 is pushed on the lower surface of the metal frame (30G). On four accommodation openings 30 of the metal frame (30O) shown in FIG. 4B, the crimping portions 36 are formed at the same time as shown in FIG. 5A. With this step, a combined wiring board 100, made up of printed wiring boards 10 and a metal frame (30G) as shown in FIG. 4B, is completed ready for reflow processing.

In the combined wiring board of the first embodiment, printed wiring boards are accurately positioned in a metal frame (30G) because crimping portions 36 are formed at the same time in four accommodation openings 30 respectively. Compared with cases in which an adhesive agent is used for fixing a printed wiring board, all printed wiring boards are positioned in the metal frame (300) more accurately, and position gaps between printed wiring boards are made smaller because of simultaneous crimping. Compared with the fixing method by use of an adhesive agent, the number of processing steps may be reduced when filling and curing processing of an adhesive agent is not necessary, manufacturing efficiency thus increases, and printed wiring boards are fixed to a metal frame at low cost.

Figure 8:
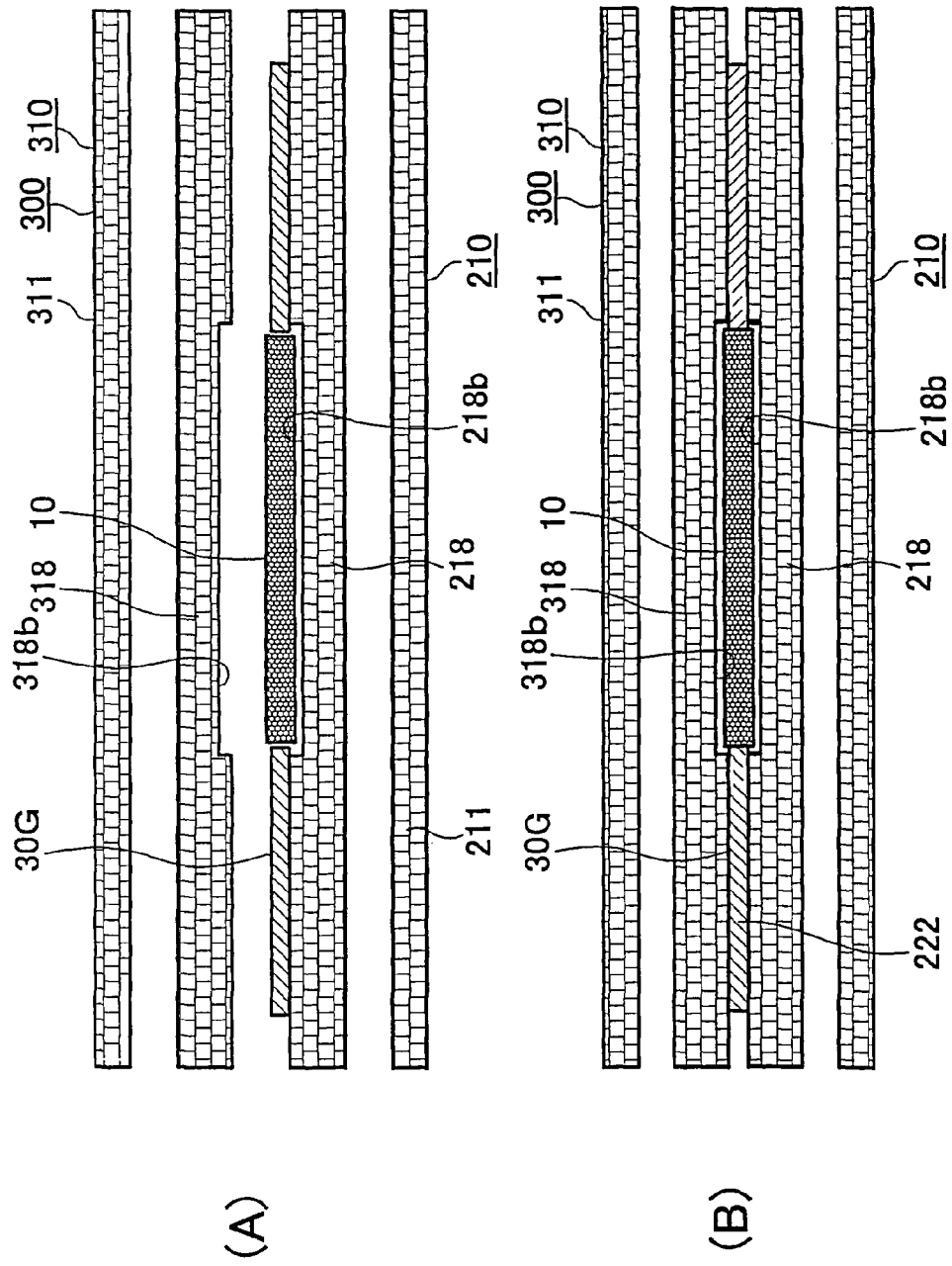
FIGS. 8A and 8B are cross-sectional views illustrating a crimping apparatus of a first modified example of the first embodiment.

FIG. 8 is a cross-sectional view illustrating a crimping apparatus 300 according to a first modified example of the first embodiment. In the first modified example of the first embodiment, by subjecting the entire metal frame (30G) to plastic deformation, without using a punch but with a support board 318 of an upper tool 310 and a support board 218 of a lower tool 210, a printed wiring board is fixed in the metal frame (30G).

To printed wiring boards 10 which are fixed in accommodation openings 30 of a metal frame (30G) as shown in FIG. 5A, solder printing, mounting of electronic components, and soldering of the electronic components in a reflow furnace are carried out. Because a reflow temperature set to be approximately 200° C. is higher than the glass transition temperature Tg of the resin in a printed wiring board, the printed wiring board is subject to warping due to the weight of mounted components and residual stress in the printed wiring board. In the first embodiment, stress is exerted toward the center of the printed wiring board 10 fixed in the metal frame (30G), along with stress due to the weight of electronic components 11, as shown in FIG. 6B. However, because the thermal expansion coefficient in a direction perpendicular to the main surface of the metal frame (30G) is greater than the thermal expansion coefficient of the printed wiring board 10 as described above, the metal frame (30G) expands in a planar direction more than the printed wiring board 10 does, so that stress (F1) is exerted toward the outer rim of the printed wiring board 10 fixed in the accommodation opening 30 to offset the above-described stress toward the center of the printed wiring board 10. Accordingly, a printed wiring board in reflow processing does not warp.

Figure 9:
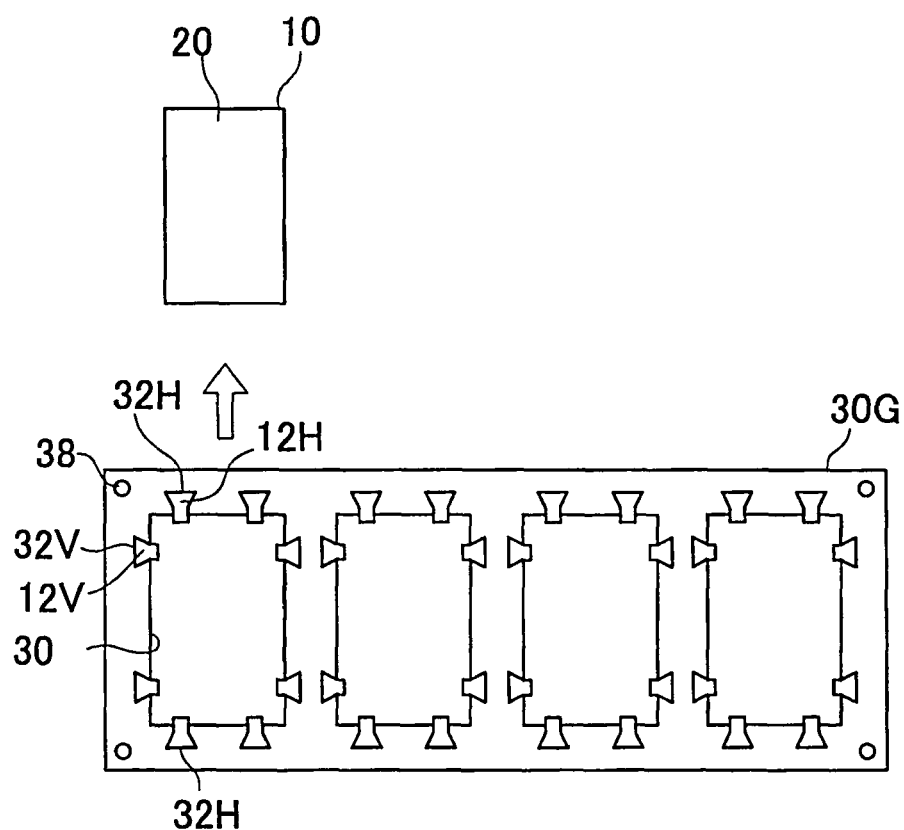
FIG. 9 is a plan view of a printed wiring board separated from a combined wiring board.

As shown in FIG. 9, after the mounting of electronic components, the rectangular main body 20 of the printed wiring board is removed from the support tabs (12H, 12V) of the printed wiring board and detached from the metal frame (30G) with the support tabs (12H, 12V) left in the slits (32H, 32V) of the accommodation openings 30.

Second Modified Example of First Embodiment

Figure 12:
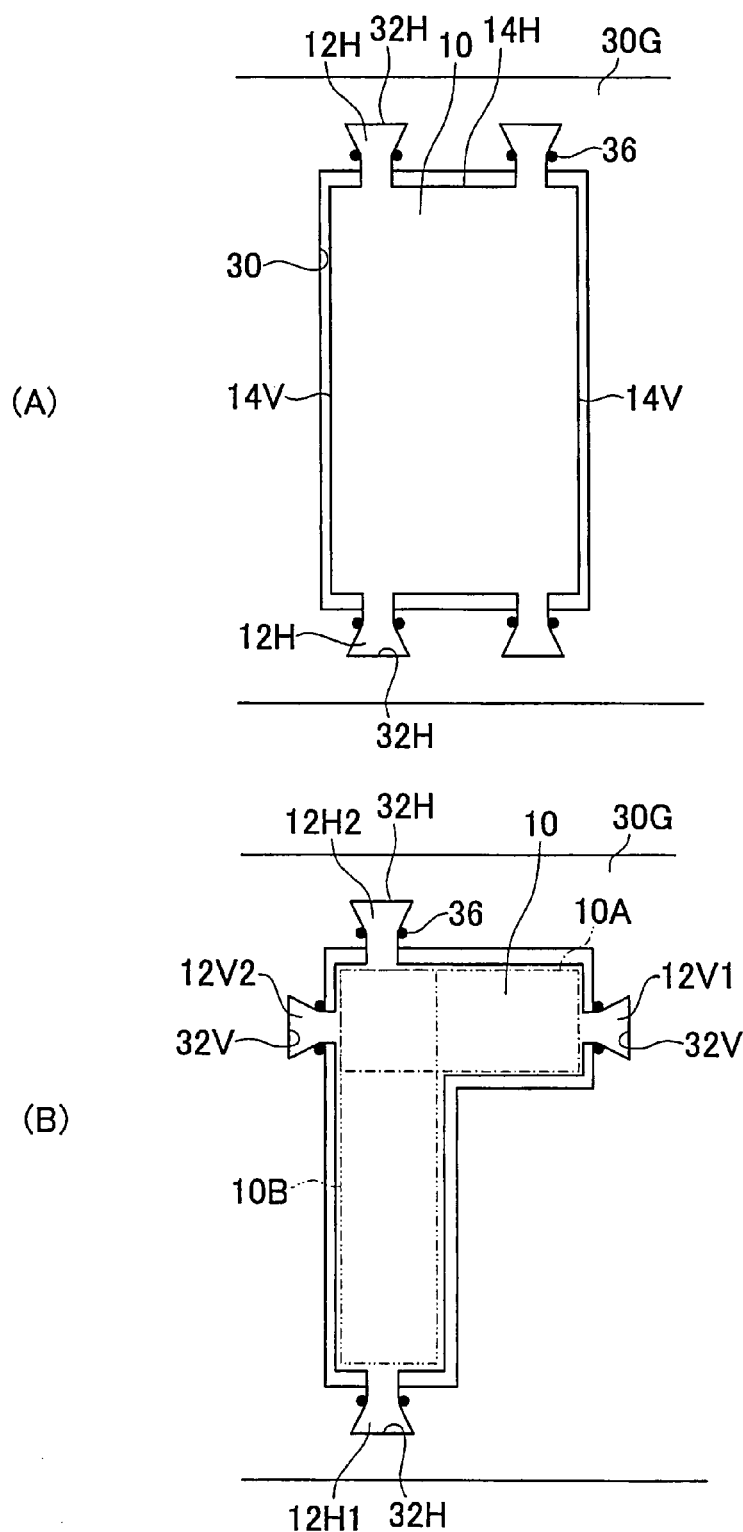
FIGS. 12A and 12B are plan views of combined wiring boards according to a second modified example of the first embodiment and a third modified example of the first embodiment respectively.

FIG. 12A illustrates a combined wiring board according to a second modified example of the first embodiment.

In the second modified example of the first embodiment, the printed wiring board 10 has two support tabs (12H) on each short-side sidewall (14H) of the rectangular main body 20 in such a way that the pair of support tabs on each side faces each other across the main body 20. No support tab is formed on the long-side sidewall (14V). The second modified example of the first embodiment has an advantage in that a printed wiring board is easily fabricated.

Third Modified Example of First Embodiment

FIG. 12B illustrates a combined wiring board according to a third modified example of the first embodiment.

In the third modified example of the first embodiment, a printed wiring board 10 is positioned in the L-shaped structure, which is a combination of a rectangular shape (10A) and a rectangular shape (10B). A support tab (12V1) is formed on the upper right edge of the L-shape in FIG. 12B and a support tab (12V2) is formed on a portion opposite the support tab (12V1). Similarly, a support tab (12H1) is formed on the bottom edge of the L-shape in FIG. 12B and a support tab (12H2) is formed on a portion opposite the support tab (12H1). That is, two opposing short sides of each of the rectangular shapes (10A, 10B) are connected to the accommodation opening 30 of the metal frame (30G) and two opposing long sides are not connected to the accommodation opening 30. As shown in the third modified example of the first embodiment, with structures of the first embodiment, a printed wiring board of any shape can be fixed in a metal frame by forming support tabs on opposing portions of the printed wiring board.

Second Embodiment

Figure 13:
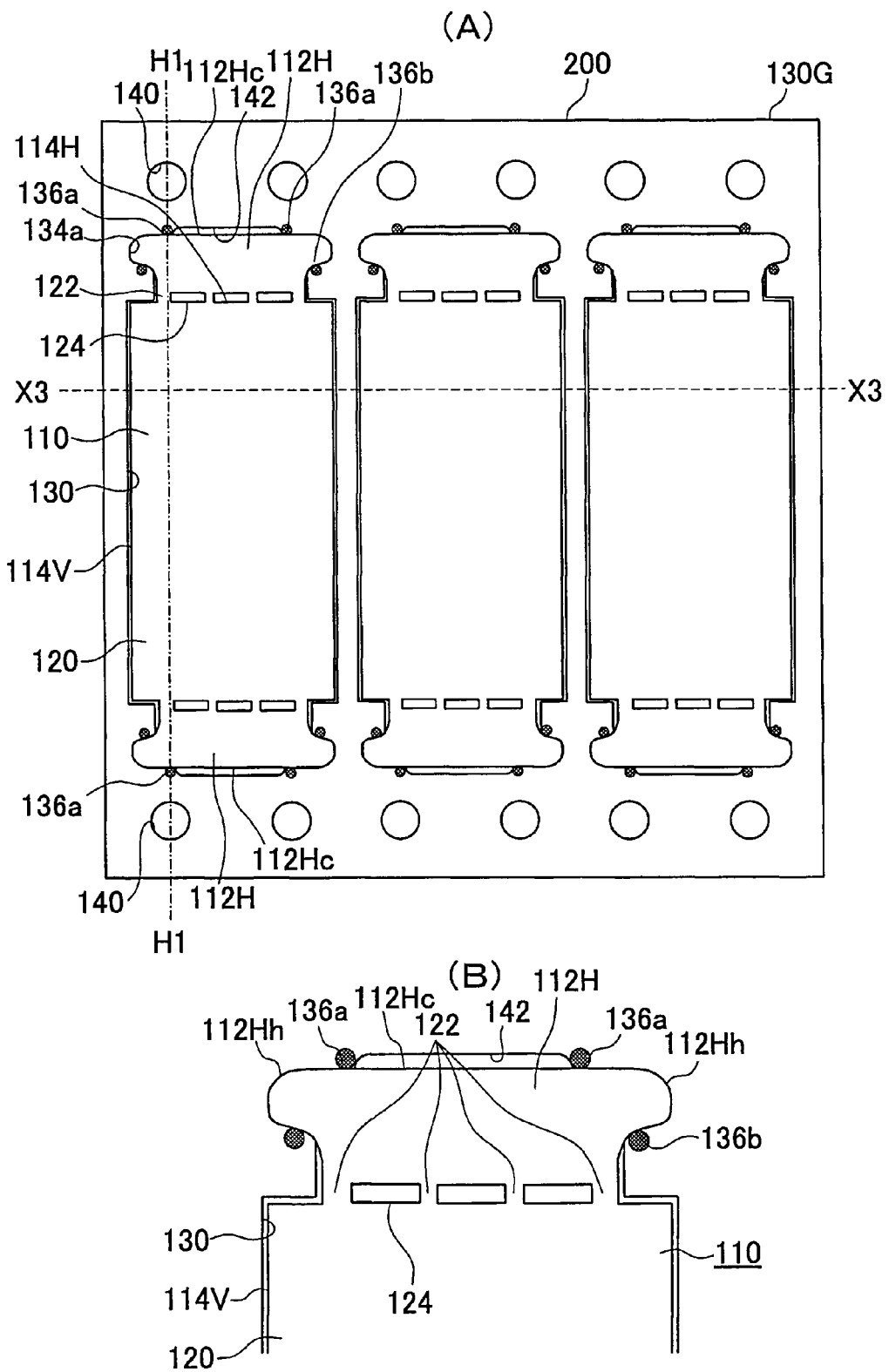
FIGS. 13A and 13B are plan views respectively illustrating a combined wiring board and a support portion of a printed wiring board according to a second embodiment.

FIG. 13A illustrates a combined wiring board 200 according to a second embodiment.

A printed wiring board 110 is fixed in each of three accommodation openings 130 in a metal frame (130G). FIG. 6C is a cross-sectional view taken along the (X3-X3) line of a combined wiring board in FIG. 13A. The metal frame (130G) has a thickness (t1) of 750 μm. The printed wiring board 110 has a thickness (t2) of 780 μm. The center plane (C1) in the thickness direction of the metal frame (130G) aligns with the center plane (C2) in the thickness direction of the printed wiring board 110. Accordingly, the upper surface of the metal frame (130G) is recessed from the upper surface (the first surface) (F) of the printed wiring board 110 and the lower surface of the metal frame (130G) is recessed from the lower surface (the second surface) (S) of the printed wiring board. The metal frame (130G), which is made of aluminum, has a thermal expansion coefficient of 23 ppm/° C. in a direction perpendicular to the main surface, and the printed wiring board, which is made of resin, has a thermal expansion coefficient of 16 ppm/° C. in a direction perpendicular to the main surface.

The printed wiring board 110 has two support tabs (112H) on each short-side sidewall (114H) of a rectangular main body 120 in such a way that the pair of support tabs on each side faces each other across the main body 120. A support portion (112H) is connected to the main body 120 with bridge portions 122 which are formed by opening slits 124. As shown in FIG. 13B, the bridge portions 122 are formed between the slits 124 and between the slit 124 and a sidewall.

The support portion (112H) has a pair of extension tabs (112Hh) positioned at both sides and having a width increasing in a substantial U-shape, and crimping portions (136a) and (136b) are formed at the base portion of the extension tabs (112Hh). With the crimping portions (136a, 136b), the sidewalls of the accommodation opening 130 and the sidewalls of the extension tabs (112Hh) are pushed against and are in contact with each other. The sidewall of the printed wiring board and the sidewall of the accommodation opening are not in contact with each other at any portion except for the extension tabs (112Hh) clamped by the crimping portions (136a, 136b). A recess 142 is also formed in the accommodation opening 130 in order to avoid interference by a straight section (112Hc) between the crimping portions (136a). Accordingly, stress is prevented from being exerted on the straight section (112Hc) in a thermal contraction process of the printed wiring board. Similarly, a long-side sidewall (114V) of the main body 120 and the accommodation opening 130 have clearance between them. As shown by a dashed line (H1-H1) in FIG. 13A, an opening 140 is formed on the line connecting the crimping portion (136a), which is formed at an edge of the straight section (112Hc) of the support portion (112H) at one side, to the crimping portion (136a), which is formed at an edge of the straight section (112Hc) of the support portion (112H) on the other side. As a result, stress is mitigated from being exerted excessively on the printed wiring board in a perpendicular direction during reflow processing. With the slits 124 being arranged avoiding a portion on the line between a pair of the crimping portions (136a), stress is mitigated uniformly inside the printed wiring board.

FIG. 14A shows the metal frame (130G) in which the bridge portion 122 between the slits 124 is removed and from which the main body 120 of the printed wiring board shown in FIG. 14B is separated. The support portion (112H) of the printed wiring board is left on the metal frame (130G). In the second embodiment, with the slits 124 being formed in advance, the main body 120 of the printed wiring board is easily separated.

In the multipiece wiring board accommodation kit in JP 2011-23657 A, a piece wiring board and an accommodation hole of the frame are bonded by injecting an adhesive agent into a gap between them. Because an adhesive agent that bonds different materials together is necessary for this process and a process step for filling and curing of the adhesive agent is necessary, manufacturing efficiency is likely to decrease. Misalignment between wiring boards also tends to increase because the wiring boards are fixed in accommodation holes one by one. It may lead to a decrease in the yield in subsequent production steps.

A method for manufacturing a combined wiring board according to an embodiment of the present invention includes the steps of: preparing a wiring board; preparing a metal frame that has an opening for containing the wiring board; positioning the wiring board in the opening of the metal frame; and connecting a sidewall of the wiring board to a sidewall in an opening of the metal frame by subjecting the metal frame to plastic deformation.

In a method for manufacturing a combined wiring board according to an embodiment of the present invention, a wiring board is fixed in a metal frame by subjecting the metal frame to plastic deformation. Therefore, compared with a fixing method that uses an adhesive agent, the number of processing steps is reduced when filling and curing of an adhesive agent is not necessary, manufacturing efficiency thus increases, and the wiring boards can be fixed in a metal frame at low cost. Compared with a case in which an adhesive agent is used for fixing a wiring board in each opening, all wiring boards are positioned in a metal frame more accurately and positional gaps between wiring boards are made smaller because of simultaneous plastic deformation.

Obviously, numerous modifications and variations of the present invention are possible in light of the above teachings. It is therefore to be understood that within the scope of the appended claims, the invention may be practiced otherwise than as specifically described herein.

What is claimed is:
1. A method for manufacturing a combined wiring board, comprising:
   providing a metal frame having an accommodation opening portion;
   positioning a wiring board in the accommodation opening portion of the metal frame; and
   subjecting the metal frame to plastic deformation such that a sidewall of the wiring board is connected to a sidewall of the metal frame inside the accommodation opening portion of the metal frame and that the wiring board is fixed to the metal frame inside the accommodation opening portion of the metal frame,
   wherein the metal frame does not have an adhesive agent fixing the wiring board inside the accommodation opening portion.

2. The method for manufacturing a combined wiring board according to claim 1, wherein the metal frame has a thickness which is less than a thickness of the wiring board, and the wiring board is positioned in the accommodation opening portion such that front and back surfaces of the metal frame do not project beyond front and back surfaces of the wiring board.

3. The method for manufacturing a combined wiring board according to claim 2, wherein the wiring board is positioned in the accommodation opening portion such that a center plane of the wiring board in a thickness direction of the wiring board is aligned with a center plane of the metal frame in a thickness direction of the metal frame.

4. The method for manufacturing a combined wiring board according to claim 3, wherein the metal frame has a plurality of accommodation opening portions including the accommodation opening portion, and the metal frame is subjected to the plastic deformation such that a plurality of wiring boards including the wiring board is simultaneously connected to sidewalls of the metal frame inside the accommodation opening portions of the metal frame, respectively.

5. The method for manufacturing a combined wiring board according to claim 2, wherein the metal frame has a plurality of accommodation opening portions including the accommodation opening portion, and the metal frame is subjected to the plastic deformation such that a plurality of wiring boards including the wiring board is simultaneously connected to sidewalls of the metal frame inside the accommodation opening portions of the metal frame, respectively.

6. The method for manufacturing a combined wiring board according to claim 1, wherein the subjecting of the metal frame to the plastic deformation includes applying pressure to front and back surfaces of the metal frame.

7. The method for manufacturing a combined wiring board according to claim 6, wherein the metal frame has a plurality of accommodation opening portions including the accommodation opening portion, and the metal frame is subjected to the plastic deformation such that a plurality of wiring boards including the wiring board is simultaneously connected to sidewalls of the metal frame inside the accommodation opening portions of the metal frame, respectively.

8. The method for manufacturing a combined wiring board according to claim 1, wherein the metal frame has a plurality of accommodation opening portions including the accommodation opening portion, and the metal frame is subjected to the plastic deformation such that a plurality of wiring boards including the wiring board is simultaneously connected to sidewalls of the metal frame inside the accommodation opening portions of the metal frame, respectively.

9. The method for manufacturing a combined wiring board according to claim 1, wherein the metal frame has a thickness which is less than a thickness of the wiring board.

10. A combined wiring board, comprising:
a metal frame having an accommodation opening portion; and
a wiring board fixed to the metal frame inside the accommodation opening portion such that the metal frame has a side wall defining the accommodation opening portion and connected to a side wall of the wiring board,
wherein the metal frame has a portion subjected to plastic deformation such that the side wall of the metal frame holds the side wall of the wiring board inside the accommodation opening portion of the metal frame, and the metal frame does not have an adhesive agent fixing the wiring board inside the accommodation opening portion.

11. The combined wiring board according to claim 10, wherein the wiring board has a main body, a support portion and a bridge portion connecting the main body and the support portion, the metal frame has a support slit portion configured to engage with the support portion of the wiring board, and the support slit portion of the metal frame has a shape which is tapering such that a width of the support slit portion is increasing away from the accommodation opening portion.

12. The combined wiring board according to claim 11, wherein the support portion of the wiring board is connected to the metal frame such that the support portion of the wiring board is in contact with a side wall of the metal frame defining the support slit portion of the metal frame.

13. The combined wiring board according to claim 10, wherein the wiring board is held inside the accommodation opening portion of the metal frame such that front and back surfaces of the metal frame do not project beyond front and back surfaces of the wiring board.

14. The combined wiring board according to claim 13, wherein the metal frame has a plurality of accommodation opening portions including the accommodation opening portion, and the metal frame is subjected to the plastic deformation such that a plurality of wiring boards including the wiring board is connected to sidewalls of the metal frame inside the accommodation opening portions of the metal frame, respectively.

15. The combined wiring board according to claim 10, wherein the wiring board is positioned in the accommodation opening portion such that a center plane of the wiring board in a thickness direction of the wiring board is aligned with a center plane of the metal frame in a thickness direction of the metal frame.

16. The combined wiring board according to claim 10, wherein the wiring board has a main body, a support portion and a bridge portion connecting the main body and the support portion, and the metal frame has a support slit portion configured to engage with the support portion of the wiring board.

17. The combined wiring board according to claim 16, wherein the support portion of the wiring board is connected to the metal frame such that the support portion of the wiring board is in contact with a side wall of the metal frame defining the support slit portion of the metal frame.

18. The combined wiring board according to claim 16, wherein the wiring board is held inside the accommodation opening portion of the metal frame such that front and back surfaces of the metal frame do not project beyond front and back surfaces of the wiring board.

19. The combined wiring board according to claim 16, wherein the wiring board is positioned in the accommodation opening portion such that a center plane of the wiring board in a thickness direction of the wiring board is aligned with a center plane of the metal frame in a thickness direction of the metal frame.

20. The combined wiring board according to claim 10, wherein the metal frame has a plurality of accommodation opening portions including the accommodation opening portion, and the metal frame is subjected to the plastic deformation such that a plurality of wiring boards including the wiring board is connected to sidewalls of the metal frame inside the accommodation opening portions of the metal frame, respectively.

21. The combined wiring board according to claim 20, wherein each of the wiring boards is positioned in a respective one of the accommodation opening portions such that center planes of the wiring boards in a thickness direction of each of the wiring boards is aligned with a center plane of the metal frame in a thickness direction of the metal frame.

* * * * *